US006583436B2

(12) United States Patent
Petroff et al.

(10) Patent No.: US 6,583,436 B2
(45) Date of Patent: Jun. 24, 2003

(54) STRAIN-ENGINEERED, SELF-ASSEMBLED, SEMICONDUCTOR QUANTUM DOT LATTICES

(75) Inventors: Pierre M. Petroff, Santa Barbara, CA (US); James S. Speck, Goleta, CA (US); Jo Anna Johnson, Novi, MI (US); Hao Lee, Pasadena, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 09/893,760

(22) Filed: Jun. 27, 2001

(65) Prior Publication Data

US 2002/0074543 A1 Jun. 20, 2002

Related U.S. Application Data

(60) Provisional application No. 60/214,479, filed on Jun. 27, 2000.

(51) Int. Cl.[7] ................................................ H01L 29/06
(52) U.S. Cl. ............................ 257/18; 257/15; 257/22; 257/17; 257/14; 438/87; 438/184
(58) Field of Search ............................ 257/15, 18, 22, 257/17, 14; 438/87, 184, 615

(56) References Cited

U.S. PATENT DOCUMENTS

| | | | |
|---|---|---|---|
| 4,749,952 A | 6/1988 | Morimoto | |
| 4,952,792 A | 8/1990 | Caridi | |
| 5,614,435 A | 3/1997 | Petroff et al. | |
| 5,734,174 A | 3/1998 | Horiguchi | |
| 6,074,892 A | 6/2000 | Bowers et al. | |
| 6,239,449 B1 | 5/2001 | Fafard et al. | |

OTHER PUBLICATIONS

F. Findeis, A. Zrenner, M. Markmann, G. Bohm, G. Abstreiter, "Multi–Exciton Spectroscopy on a Self–Assembled InGaAs/GaAs Quantum Dot," Physica E 7, (2000), pp. 354–358.*

M. Grundmann, N.N. Ledentsov, O. Stier, J. Bohrer, D. Bimberg, V.M. Ustinov, P.S. Kop'ev, and Zh. I. Alferov, "Nature of Optical Transitions in Self–Organized InGaAs/ GaAs Quantum Dots," Physical Review B, vol. 53, No. 17, (1996), pp. 509–511.*

Kash, K. et al., "Observation of Quantum Dot Levels Produced by Strain Modulation of GaAs–AlGaAs Quantum Wells", *Journal of Vacuum Science and Technology*, V. 10, No. 4, Jul. 1992, pp. 2030–2033.

Sopanen, M. et al., "Strain–induced Quantum Dots by Self–organized Stressors", *Applied Physics Letters*, vol. 66, No. 18, May 1, 1995, pp. 2364–2366.

Lee, H. et al., "Controlled Ordering and Positioning of InAs Self–assembled Quantum Dots", *Journal of Vacuum Science and Technology*, V. 18, No. 4, Jul. 2000, pp. 2193–2196.

(List continued on next page.)

*Primary Examiner*—Tom Thomas
*Assistant Examiner*—Thomas Magee
(74) *Attorney, Agent, or Firm*—Gates & Cooper LLP

(57) ABSTRACT

A method for growing strain-engineered, self-assembled, semiconductor quantum dots (QDs) into ordered lattices. The nucleation and positioning of QDs into lattices is achieved using a periodic sub-surface lattice built-up on a substrate, stressor layer, and spacer layer. The unit cell dimensions, orientation and the number of QDs in the basis are tunable. Moreover, a 2D lattice can be replicated at periodic intervals along the growth direction to form a three-dimensional (3D) lattice of QDs.

30 Claims, 8 Drawing Sheets

(2 of 8 Drawing Sheet(s) Filed in Color)

OTHER PUBLICATIONS

Lee, H. et al., "Strain–engineered Self–assembled Quantum Dot Lattices", *Applied Physics Letters*, V. 78, No. 1, Jan 1, 2001, pp. 105–107.

Y. Arakawa et al., "Multidimensional Quantum Well Laser and Temperature Dependence of its Threshold Current," Appl. Phys. Lett., Jun. 1982, 40(11): 939–941.

C.S. Chen et al., "Formation of Nitrogen–Oxygen Donors in N–Doped Czochralski–Silicon Crystal," J. Appl. Phys., Sep. 1994, 76(6): 3347–3350.

E. Dekel et al., "Multiexciton Spectroscopy of a Single Self–Assembled Quantum Dot," The American Physical Society, 1998, 80(22): 4991–4994.

D.G. Deppe et al., "Quantum–Dot Vertical–Cavity Surface–Emitting Laser Based on the Purcell Effect," Appl. Phys. Lett., 1999, 75(22): 3455–3457.

H. Drexler et al., "Spectroscopy of Quantum Levels in Charge–Tunable InGaAs Quantum Dots," Phys. Rev. Lett. 1994, 73(16): 2252–2255.

F. Findeis, et al., "Multi–Exciton Spectroscopy on a Self–Assembled InGaAs/GaAs Quantum Dot," Elsevier Science B.V., Physica E 7, 2000, 354–358.

M. Fricke et al., "Shell Structure and Electron–Electron Interaction in Self–Assembled InAs Quantum Dots," Europhys. Lett., 1996, 36(3): 197–202.

K. Georgsson et al., "Transmission Electron Microscopy Investigation of the Morphology of InP Stranski–Krastanow Islands Grown by Metalorganic Chemical Vapor Deposition," Appl. Phys. Lett., 1995, 67(20): 2981–2982.

L. Goldstein et al., "Growth by Molecular Beam Epitaxy and Characterization of InAs/GaAs Strained–Layer Superlattices," Appl. Phys. Lett., 1985, 47(10): 1099–1101.

M. Grundmann et al., "Nature of Optical Transitions in Self–Organized InAs/GaAs Quantum Dots," The American Physical Society, Phys. Rev. B., 1996, 53(16): R10509–R10511.

D.L. Huffaker et al., "1.3 $\mu$m Room–Temperature GaAs–Based Quantum–Dot Laser," Appl. Phys. Lett., 1998, 73(18): 2564–2566.

G. Jin et al., "Controlled Arrangement of Self–Organized Ge Islands on Patterned Si (001) Substrates," Appl. Phys. Lett., 1999, 75(18): 2752–2754.

G. Jin et al, "Regimented Placement of Self–Assembled Ge Dots on Selectively Grown Si Mesas," Appl. Phys. Lett., 2000, 76(24): 3591–3593.

T.I. Kamins et al, "Lithographic Positioning of Self–Assembled Ge Islands on Si(001)," Appl. Phys. Lett. 1997, 71(9): 1201–1203.

N. Kirstaedter et al., "Low Threshold, Large $T_o$ Injection Laser Emission from (InGa)As Quantum Dots," Elec. Lett., 1994, 30(17): 1416–1417.

A. Konkar et al., "Stress–Engineered Spatially Selective Self–Assembly of Strained InAs Quantum Dots on Nonplanar Patterned GaAs(001) Substrates," Appl. Phys. Lett., 1998, 72(2): 220–222.

H. Lee et al., "Controlled Ordering and Positioning of InAs Self–Assembled Quantum Dots," J. Vac. Sci. Technol. B, 2000, 18(4): 2193–2196.

H. Lee et al., "Formation of InAs/GaAs Quantum Dots by Molecular Beam Epitaxy: Reversibility of the Islanding Transition," Appl. Phys. Lett., 1997, 71(16): 2325–2327.

D. Leonard et al., "Critical Layer Thickness for Self–Assembled InAs Islands on GaAs," The American Physical Society, Phys Rev. B, 1994, 50(16): 11687–11692.

D. Leonard et al., "Direct Formation of Quantum–Sized Dots from Uniform Coherent Islands of InGaAs on GaAs Surfaces," Appl. Phys. Lett., 1993, 63(23): 3203–3205.

T. Lundstrom et al, "Exciton Storage in Semiconductor Self–Assembled Quantum Dots," Science Magazine, 1999, 286: 2312–2314.

R.J. Luyken et al., "The Dynamics of Tunneling into Self–Assembled InAs Dots," Appl. Phys. Lett., 1999, 74(17): 2486–2488.

S. Maimon et al, "Intersublevel Transitions in InAs/GaAs Quantum Dots Infrared Photodetectors," Appl. Phys. Lett., 1998, 73(14): 2003–2005.

J–Y. Marzin et al., "Photoluminescence of Single InAs Quantum Dots Obtained by Self–Organized Growth on GaAs," Phys. Rev. Lett., 1994, 73(5): 716–719.

G. Medeiros–Ribeiro et al., "Electron and Hole Energy Levels in InAs Self–Assembled Quantum Dots," Appl. Phys. Lett., 1995, 66(14): 1767–1769.

Y–W. Mo et al., "Kinetic Pathway in Stranski–Krastanov Growth of Ge on Si(001)," Phys. Rev. Lett. 1990, 65(8): 1020–1023.

D.S.L. Mui et al., "Surface Migration Induced Self–Aligned InAs Islands Grown by Molecular Beam Epitaxy," Appl. Phys. Lett., 1995, 66(13): 1620–1622.

T.T. Ngo et al., "Kinetic Routes to the Growth of Monodisperse Islands," Appl. Phys. Lett., 1995, 66(15): 1906–1908.

T.T. Ngo et al., "Simulation Model for Self–Ordering of Strained Islands in Molecular–Beam Epitaxy," Phys. Rev. B., 1996, 53(15): 9618–9621.

D. Pan et al., "Normal–Incidence Intersubband (In, Ga)As/GaAs Quantum Dot Infrared Photdetectors," Appl. Phys. Lett., 1998, 73(14): 1937–1939.

F.M. Ross et al., "Coarsening of Self–Assembled Ge Quantum Dots on Si(001)," Phys. Rev. Lett., 1998, 80(5): 984–987.

G. Springholz et al., "Self–Organized Growth of Three–Dimensional Quantum Dot Crystals with fcc–Like Stacking and a Tunable Lattice Constant," Science Magazine, 1998, 282: 734–737.

J. Tersoff et al., "Self–Organization in Growth of Quantum Dot Superlattices," Phys. Rev. Lett., 1996, 76(10): 1675–1678.

G. Wang et al., "Time–Resolved Optical Characterization of InGaAs/GaAs Quantum Dots," Appl. Phys. Lett., 1994, 64(21): 2815–2817.

R.J. Warburton et al., "Coulomb Interactions in Small Charge–Tunable Quantum Dots: A Simple Model," Phys. Rev. B, 1998, 58(24): 16221–16231.

A. Wójs et al., "Theory of Luminescence from Highly Excited Self–Assembled Quantum Dots," Elsevier Science B.V., Physica E 2, 1998, 603–608.

Q. Xie et al., "Vertically Self–Organized InAs Quantum Box Islands on GaAs(100)," Phys. Rev. Lett., 1995, 75(13): 2542–2545.

S. Zimmermann et al., "A Semiconductor–Based Photonic Memory Cell," Science Magazine, 1999, 283: 1292–1295.

\* cited by examiner

STRAIN-ENGINEERED, SELF-ASSEMBLED, SEMICONDUCTOR QUANTUM DOT LATTICES

CROSS-REFERENCE TO RELATED APPLICATIONS

This application claims priority under 35 U.S.C. §119(e) to U.S. Provisional Patent Application No. 60/214,479, filed Jun. 27, 2000, by Pierre M. Petroff, entitled "SELF-ASSEMBLED NANO-CLUSTERED AND QUANTUM DOT LATTICES," which application is incorporated by reference herein.

STATEMENT REGARDING FEDERALLY SPONSORED RESEARCH OR DEVELOPMENT

This invention was made with Government Support under Grant No. F49620-98-1-0367, awarded by the Air Force Office of Scientific Research. The Government has certain rights in this invention.

BACKGROUND OF THE INVENTION

1. Field of the Invention

The present invention relates to fabrication processes and structures for quantum dots, and in particular, for semiconductor quantum dots lattices and the process for making same.

2. Description of the Related Art (Note: This application references a number of different publications as indicated throughout the specification by reference numbers enclosed in brackets, e.g., [x]. A list of these different publications ordered according to these reference numbers can be found below in the Section entitled "References" in the Detailed Description of the Preferred Embodiment. Each of these publications is incorporated by reference herein.)

Self-assembled semiconductor quantum dots (QDs) [1–7] provide a convenient means of exploring the physics of zero-dimensional (0D) quantum-confined systems. The size of QDs is on the order of an electron wavelength and carrier energy levels are quantized. The sequential loading of electrons and holes and the three-dimensional (3D) confinement character of the carriers in the QDs have been previously demonstrated [7–9]. The sharp density of states in the QDs yields, as expected, ultra narrow luminescence lines and several studies have recently shown the importance and complexity of many-body effects in the relaxation processes involved in strongly excited quantum dots [10–13]. In addition to their 'atom-like' properties, the potential application of QDs has been explored in a wide variety of novel devices [14–18].

Moving from random arrays of "atom-like" QDs to a QD lattice would offer the possibility of novel and unexpected properties that are tied to electronic or photonic QD coupling within an array of QDs. Ideally, the QD lattice should have long-range order, as well as a controllable crystal structure with an adjustable number of QDs in the basis. These ideal properties have not yet been achieved, and usually when discussing properties of self-assembled QDs, one deals either with an isolated QD or an ensemble of QDs that are randomly distributed on a plane within a structure. In this case, electronic coupling is not controlled and is dependent on the QDs' density.

This invention describes a method for producing QD lattices with a wide variety of dimensions and orientation for the unit cell. The technique described can be applied to a wide variety of semiconductor or metal quantum dots deposited by epitaxy.

SUMMARY OF THE INVENTION

To overcome the limitations in the prior art described above, and to overcome other limitations that will become apparent upon reading and understanding the present specification, the present invention discloses a method for growing strain-engineered, self-assembled, semiconductor quantum dots (QDs) into ordered lattices. The nucleation and positioning of QDs into lattices is achieved using a periodic sub-surface lattice of stressor points and a spacer layer built-up on a substrate. Three different embodiments of two-dimensional (2D) square lattices are described herein. The unit cell dimensions, orientation and the number of QDs in the ordered lattice are tunable. Moreover, a 2D lattice can be replicated at periodic intervals along the growth direction to form a three-dimensional (3D) lattice of QDs.

BRIEF DESCRIPTION OF THE DRAWINGS

Referring now to the drawings in which like reference numbers represent corresponding parts throughout.

DETAILED DESCRIPTION OF PREFERRED EMBODIMENT

In the following description, reference is made to the accompanying drawings which form a part hereof, and which show, by way of illustration, a preferred embodiment of the present invention. It is understood that other embodiments may be utilized and structural changes may be made without departing from the scope of the present invention.

The present invention describes a method for self-assembling QDs into periodic lattices using a coherently strained layer deposited by molecular beam epitaxy (MBE) over a semiconductor substrate. The epitaxially grown QDs [1–7] usually have the shape of roughly hemispherical lenses with a base of ~5–50 nm and a height of ~2–8 nm. They are randomly nucleated along step edges and terraces on single crystal surfaces and their density can be adjusted from $10^8$–$10^{11}$ $cm^{-2}$.

Previous attempts to produce spontaneous long-range order in self-assembled QDs using epitaxial deposition may be classified in two categories: (a) pre-patterning methods, which make use of differences in atomic diffusion on facetted surfaces to control island nucleation [19]; and (b) techniques that use a built-in strain anisotropy introduced on the growing surface [20–24]. The growth of PbSe quantum dots in strain-symmetrized PbSe/Pb$_x$Eu$_{1-x}$Te superlattices [24] is an example of this second category, where the spontaneous long range QD ordering into an hexagonal lattice is associated with the strong elastic anisotropy of this material system. Remarkably, none of these techniques have been successfully exploited to show 2D and 3D coupling effects between QDs in a lattice.

QDs are formed by epitaxial deposition of coherently strained islands and their nucleation is a random process initiated at step edges [6]. The randomness of the nucleation process, even for the case of interacting nuclei growing on an infinitely long and narrow strip of surface, has been demonstrated experimentally [19] and simulated [25]. To minimize the random nucleation, a promising approach appears to nucleate the QDs on a limited surface area such as a mesa top with nanometer dimensions.

To obtain such a periodic lattice of nucleation sites, the present invention makes use of surface diffusion on facetted surfaces with a built-in lattice of stressors. The present invention uses a periodic strain pattern induced by a coherently strained subsurface stressor layer of In$_x$Ga$_{1-x}$As (x≈0.2) regrown on a {100} GaAs patterned surface.

Figure 1:
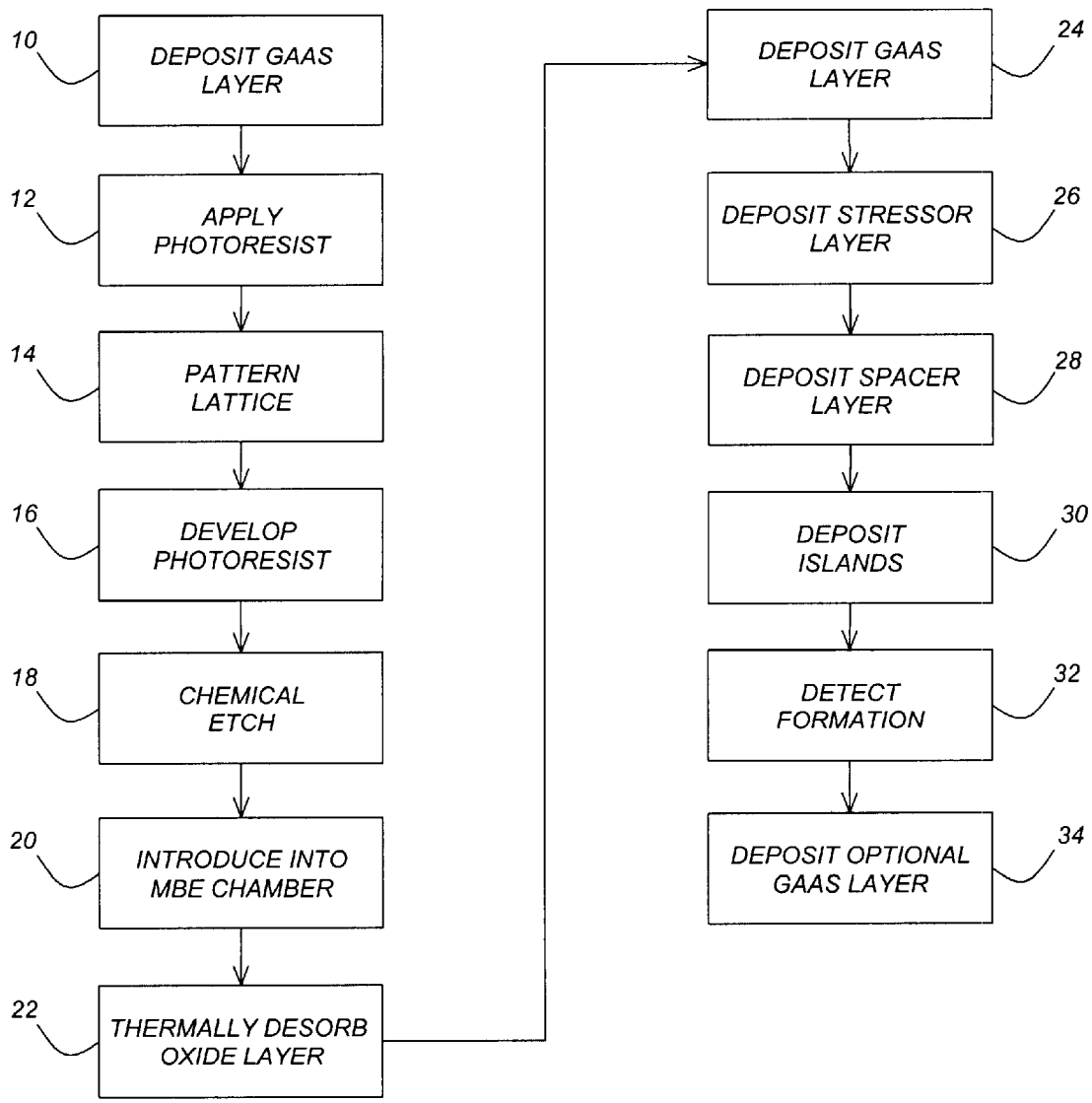
FIG. 1 is a flowchart that illustrates the steps performed in fabricating quantum dot lattices according to the preferred embodiment of the present invention.

FIG. 1 is a flowchart that illustrates the steps performed in fabricating the QD lattices according to the preferred embodiment of the present invention. A square lattice of mesas is patterned on an MBE deposited GaAs film using optical holography on a photoresist film (Block 10). After the photoresist development (Block 12), and chemical etching in a H$_3$PO$_4$:H$_2$O$_2$:H$_2$O=3:1:75 solution (Block 14), the mesas generated on the surface have a square base with ~170 nm sides and ~25 nm height. The 2D mesa square lattice has a periodicity of ~250 nm along the unit cell primitive vectors.

The processed substrates are introduced into an MBE chamber (Block 20) and the oxide layer is thermally desorbed at 630° C. under an As$_2$ flux (Block 22), before 60 nm of a GaAs layer is deposited at 600° C. to remove oxide-induced surface damage (Block 24). An In$_{0.2}$Ga$_{0.8}$As stressor layer (Block 26) and a 10 nm GaAs spacer layer (Block 28) are then deposited at lower substrate temperature (510° C.) to reduce the Indium surface migration. The sample temperature is then raised to 530° C. for the deposition of the InAs islands (Block 30). The island formation is followed by changes of the reflection high-energy electron diffraction (Rheed) pattern and their formation can be detected after ~1.7 ML of InAs deposition (Block 32). To transform the islands into QDs for photoluminescence measurements, an optional 10 nm thick top GaAs layer can be deposited on top of the islands at 600° C. (Block 34).

Figure 2:
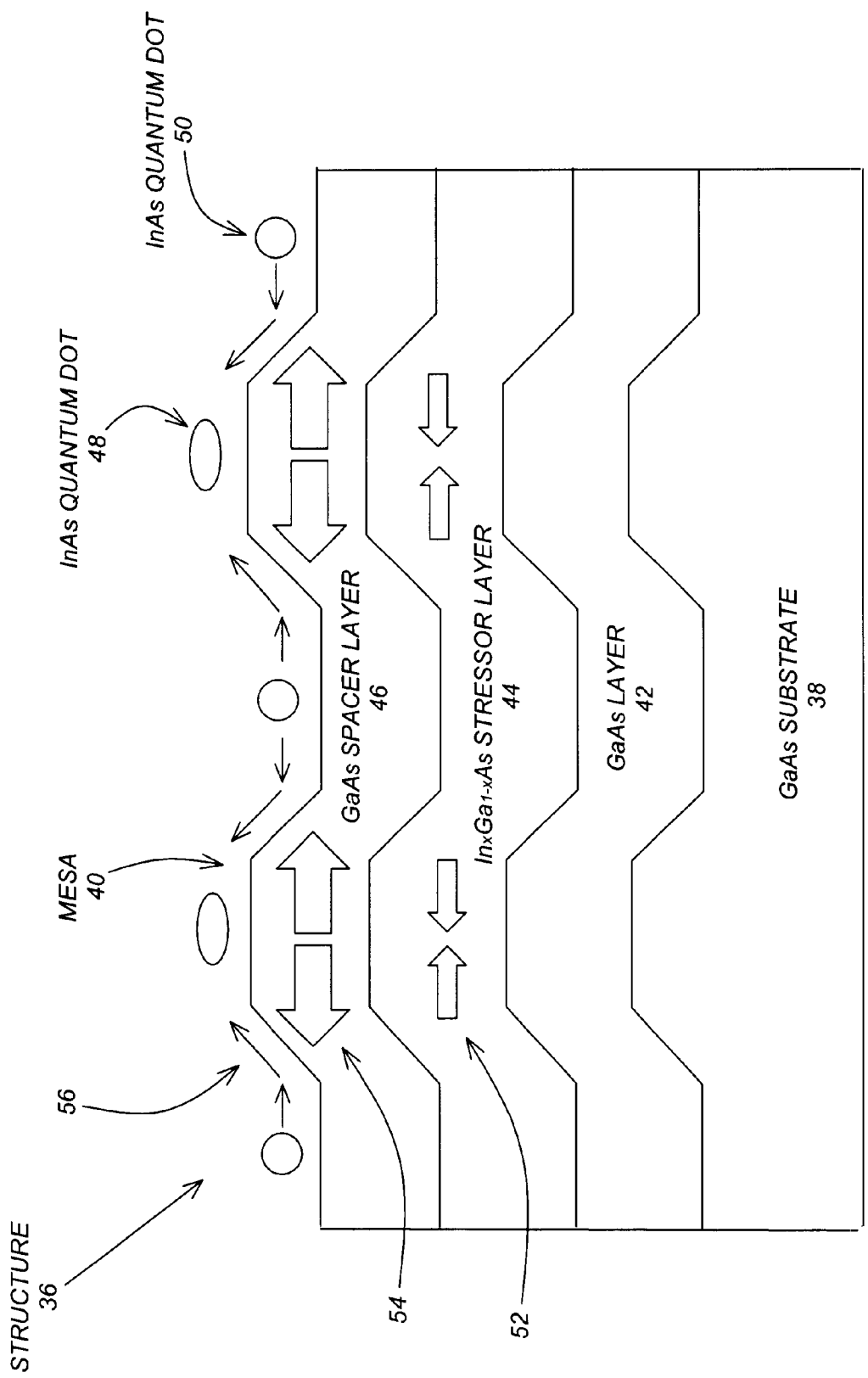
FIG. 2 is a schematic diagram showing an exemplary structure obtained by the method of FIG. 1.

FIG. 2 is a schematic diagram showing an exemplary strain-engineered, self-assembled QD structure 36 obtained by the method of FIG. 1. The structure 36 includes a GaAs substrate 38 patterned with an ordered lattice of mesas 40, wherein the mesas 40 have a base of approximately 170 nm square and a height of approximately 25 nm. In this embodiment, the ordered lattice is periodic, i.e., a two-dimensional (2D) square pattern with a period of approximately 250 nm. A GaAs layer 42 is deposited on the substrate 38, an In$_{0.2}$Ga$_{0.8}$As stressor layer 44 is deposited on the GaAs layer 42, and a GaAs spacer layer 46 is deposited on the stressor layer 44, so that the stressor layer 44 is coherently strained. Consequently, the 2D lattice is replicated at periodic intervals along the growth direction to form a three-dimensional (3D) QD lattice. Finally, the InAs QDs 48 and 50 are deposited on the spacer layer 46. FIG. 2 illustrates that islands of the InAs QDs 48 are nucleated and positioned on the mesas 40, and islands of the InAs QDs 50 are nucleated and positioned between the mesas 40, wherein the nucleation and positioning of the InAs QDs 48/50 on the mesas 40 or between the mesas 40 is a function of and controlled by the thickness of the stressor layer 44. On the other hand, the number of islands is controlled through the size of the mesa 40 tops, as well as through the amount of Indium deposited during the deposition of the InAs QDs 48 and 50. Note that arrows 52 and 54 illustrate the stress forces found in the resulting structure, while arrows 56 illustrate the movement of the InAs QDs 48 and 50. Note also that the unit cell dimensions of the ordered lattice, the orientation of the QDs, and the number of QDs are all tunable in this process.

Figure 3:
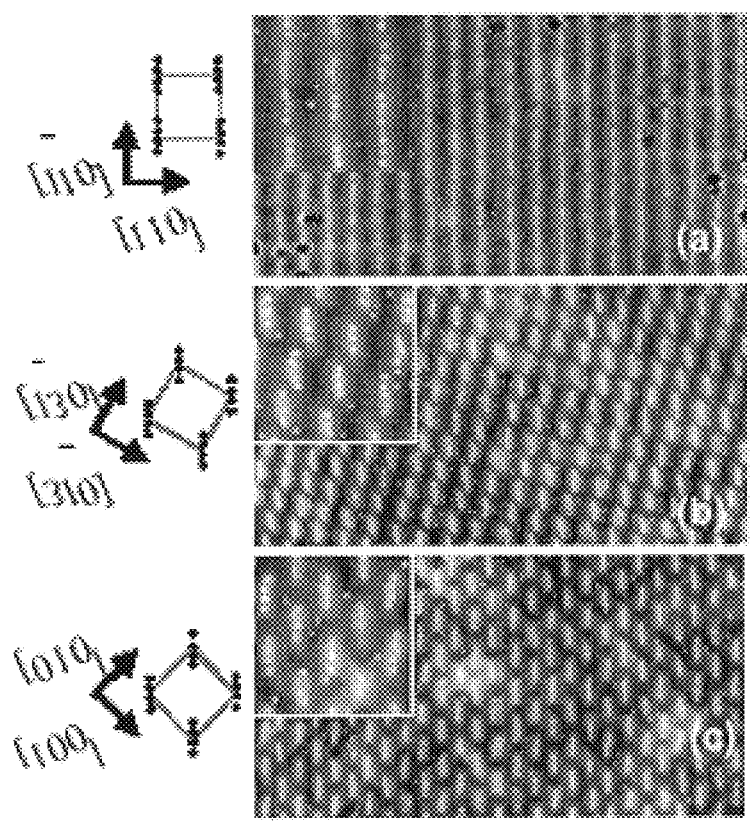
FIGS. 3(a), (b), and (c) are atomic force microscopy (AFM) images of three different island lattices formed on top of the mesas.

FIGS. 3(a), (b), and (c) are atomic force microscopy (AFM) images of three different island lattices formed on top of the mesas, each with a square unit cell and a basis of three or four quantum dots aligned along a <110> direction. The vertical direction for all the micrographs is [1$\bar{1}$0]. In this example, the unit cell dimensions are 250×250 nm for all the lattices and the unit cell vectors directions are indicated for the three different lattices in FIGS. 3(a), (b), and (c). The inserts for each lattice are also shown at higher magnification.

The three different lattices have unit cells that differ by the orientation of their unit vectors. They were obtained from substrates that were pre-patterned with the mesa edges parallel to the <100>, <110> and 30° off a <110> direction for the AFM shown in FIGS. 3(a), (c), and (b), respectively. Over 90% of InAs QDs are found on top of mesas for these samples. In all three cases, the lattice periodicity, approximately 250 nm, is that of the mesa lattice. The basis of these square lattices contains between three and four islands on average. The islands have diameters ranging from 27 to 45 nm and heights between 4 to 10 nm. When the islands are closely packed on top of the mesas, they appear separated and, within the resolution of the AFM, with no evidence for coalescence. The density of islands in these lattices is approximately 5×10 cm$^{-2}$. For a non-patterned sample, which was grown simultaneously with the patterned sample, the measured island density was approximately 7×10$^9$ cm$^{-2}$. It has been found that the lattice period is adjustable by changing the mesa lattice period. The number of islands in the basis is controlled through the amount of Indium and the mesa size.

Samples with stacks of QDs lattices of the type shown in FIG. 3(c) have also been successfully grown. Cross-sectional transmission electron microscope (TEM) image studies of these samples indicate that strain coupling effects between layers of QDs spaced by 10 nm [3] efficiently propagate the lattice of QDs from one layer to another. The cross-sectional TEM image studies also shows that these 3D QDs lattices are dislocation free.

Since the nucleation of the coherently strained InAs islands takes place as a strain relaxation process, one of the essential elements in controlling their nucleation is the presence of a periodic strain variation on the growth surface. These are formed by combining the mesa with a coherently strained layer below the surface. The nucleation of the InAs islands was compared for stressor film thickness of 0 nm, 5 nm, 10 nm, 12 nm, 15 nm, and 20 nm.

Figure 4:
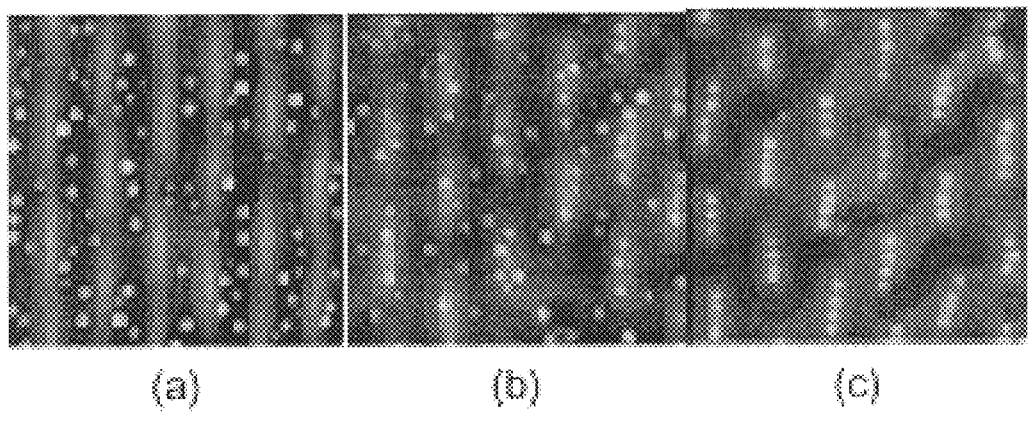
FIGS. 4(a), (b), and (c) are atomic force microscopy (AFM) images that show Indium Arsenide (InAs) islands on patterned substrates for stressor film thickness of 0 nm, 12 nm and 20 nm, respectively.

FIGS. 4(a), (b), and (c) are AFM images that show the InAs islands on patterned substrates for stressor layer thickness of 0 nm, 12 nm and 20 nm, respectively. In this structure, the lattice period is 250 nm and the unit cell sides are aligned along <100> directions while the basis of the lattice is aligned along a <110> direction. For a structure with a stressor layer thickness below 5 nm, all the islands are formed in between mesas, while for a 20 nm $In_{0.2}Ga_{0.8}As$ stressor layer nearly all islands nucleate on the mesa tops. In FIG. 4(c), the island lattice is similar to that shown in FIG. 3(c). Similar results were also observed from regrowth on mesas with different orientations or periodicity.

Figure 5:
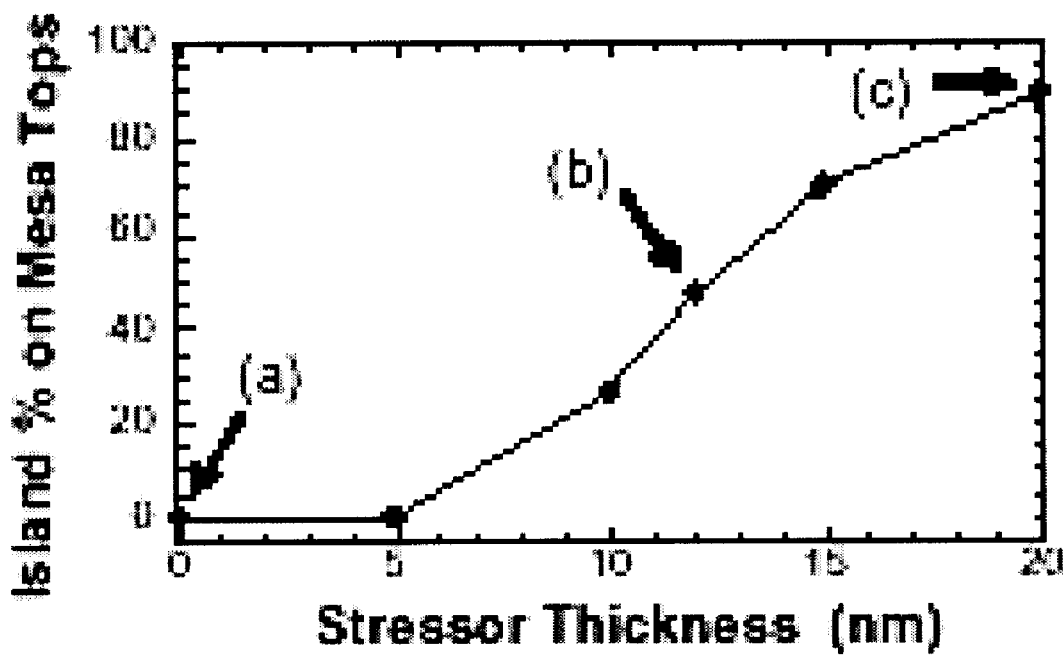
FIG. 5 is a graph that shows the percentage of InAs islands nucleating on top of the mesas as a function of the stressor layer thickness.

FIG. 5 is a graph that shows the percentage of InAs islands nucleating on top of the mesas as a function of the stressor layer thickness. The points indicated as a), b), and c) on the graph correspond to the AFM micrographs of FIGS. 4(a), (b), and (c), respectively.

To better understand the stressor layer effects, the in-plane stress distribution in the different layers is modeled using a finite element elasticity calculation. The in-plane stress is computed using a one-dimensional (1D) periodic mesa-valley structure with dimensions similar to the experimental one.

Figure 6:
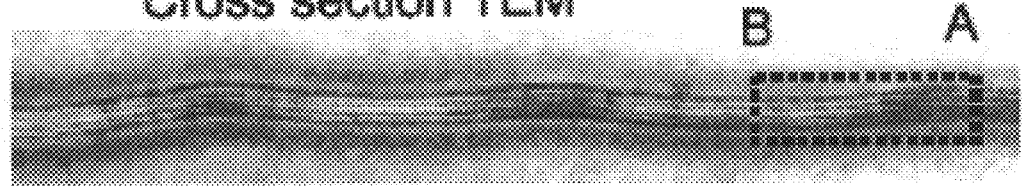
FIG. 6 is a cross-sectional transmission electron microscope (TEM) image of an $In_{0.2}Ga_{0.8}As/AlAs$ stressor film.

FIG. 6 is a cross-sectional transmission electron microscope (TEM) image of an $In_{0.2}Ga_{0.8}As$ (4 layers, 5 nm thick)/ AlAs (3 layers, 1 nm thick) stressor film. The AlAs layers have been inserted to underline the mesas and valleys profiles. The <004> dark field imaging conditions are such that the AlAs layers show as white layers. The measured height difference between the mesa tops and valleys is approximately 5 nm and the width of the mesa tops is approximately 20 nm.

As a first approximation, the $In_{0.2}Ga_{0.8}As$ stressor film thickness (20 nm) is taken as constant between the valleys and mesa tops. This assumption is supported by high-resolution, cross-sectional TEM image measurements that also show that the films are coherently strained with no dislocations.

Figure 7:
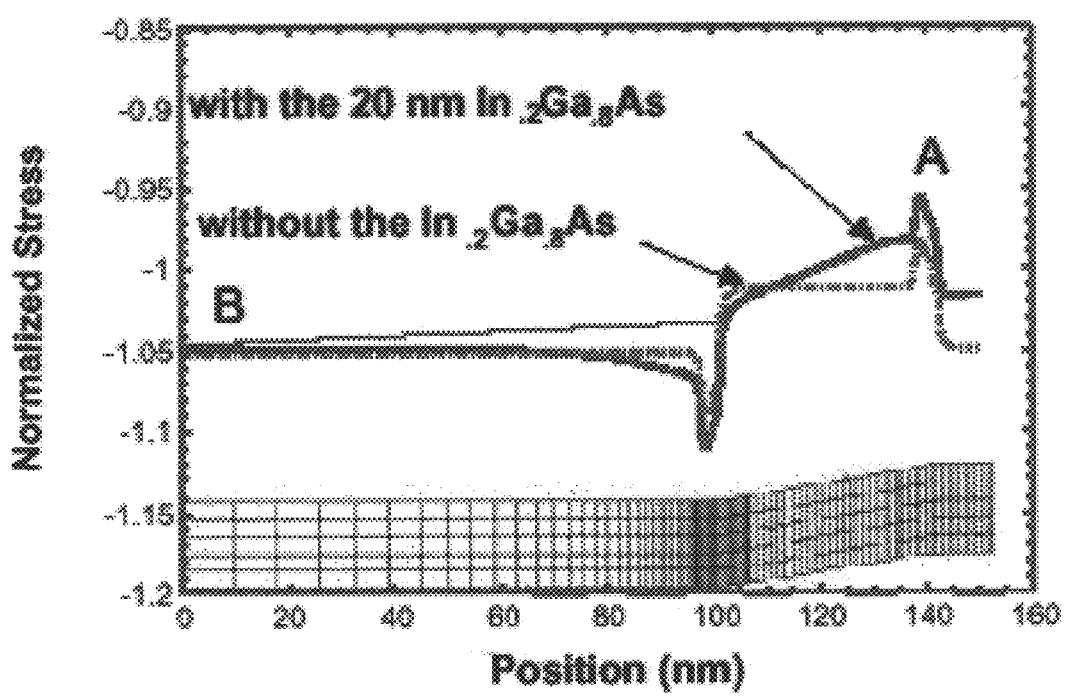
FIG. 7 is a plot of a finite element calculation of the in-plane stress distribution as a function of position in the InAs wetting layer.

FIG. 7 is a plot of a finite element calculation of the in-plane stress distribution as a function of position in the InAs wetting layer, which is formed on top of the GaAs 100Å layer prior to the nucleation of the InAs islands. The InAs wetting layer for the areas between A and B on the TEM image of FIG. 6 is represented as a solid line, while the thin grey line shows the computed stress distribution in the InAs wetting layer for a structure that does not contain a $In_{0.2}Ga_{0.8}As$ stressor layer.

The stress data for both curves have been normalized to the stress between a lattice mismatched GaAs and InAs film. The negative values of the normalized stress indicate compressive stresses and the mesh used for the calculation are also shown. The sharp spikes in the stress at the bottom and top of the facet delimiting the mesa edge are related to the finite size of the mesh used for the computation.

This simplified model, which considers a position independent In content in the stressor film, already indicates a approximately 3–4% in plane stress difference between the mesa top and valleys of the wetting layer for a structure including the $In_{0.2}Ga_{0.8}As$ stressor layer. The observed preferential nucleation of InAs islands on the mesa tops is consistent with the computed compressive stress distribution for a structure with a sufficiently thick stressor film. However, it is noted that the computed stress distribution for the structure with no stressor film does not account for the observed nucleation for islands in the valleys between the mesas (see, e.g., FIGS. 4(a), (b), (c), and 5). This is probably a result of the thermodynamic driving forces that will promote the preferential growth of the concave regions of a surface during growth.

Figure 8:
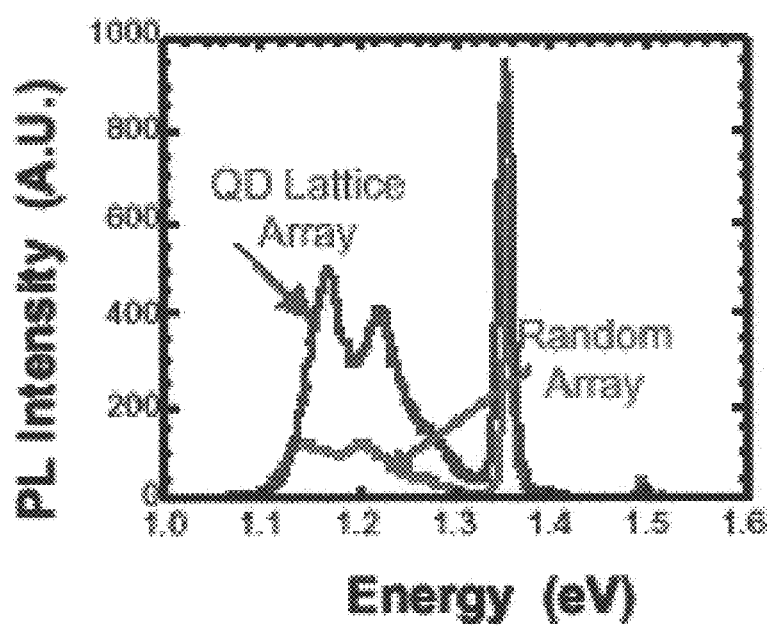
FIG. 8 illustrates the photoluminescence (PL) spectra at 4.3K of a two-dimensional quantum dot lattice and a random quantum dot ensemble deposited at the same time on an unpatterned substrate.

The electronic quality of QD lattices is an important issue for all self-assembling methods that involve a regrowth process [26]. FIG. 8 illustrates the photoluminescence (PL) spectra at 4.3K of a 2D QD lattice (dark line) and a random QD ensemble (gray line) of QDs deposited at the same time on an unpatterned substrate. In this example, the optical pump power density is $2.5KW/cm^2$. As shown in FIG. 8, the ordered lattice shows a higher PL efficiency than the random lattice deposited at the same time. For the QDs lattice, the PL peaks at 1.16 eV, 1.22 eV and 1.269 eV correspond respectively to the ground state and excited states emission. The random QD array shows PL lines at 1.142 eV, 1.203 eV and 1.269 eV, which respectively correspond to the ground state and excited states emission. The two spectra have been normalized at the GaAs Donor-Acceptor pair emission line at $\approx$1.51 eV.

The higher PL efficiency of the QD lattice is surprising since the QDs density in the lattice ($\approx 5 \times 10^9 cm^{-2}$) is about the same as that of the random array. This effect may be related to a higher collection efficiency of the mesa structure. The narrower line widths for the ordered lattice is consistent with either reduced size dispersion for the QDs in a lattice and/or electronic coupling of the closely spaced QDs in the crystal basis. In FIG. 8, the PL line at $\approx$1.34 eV is associated with the $In_{0.2}Ga_{0.8}As$ (4 layers, 5 nm thick)/AlAs (3 layers, 1 nm thick) stressor layer.

In summary, the present invention demonstrates a controlled formation of 2D and 3D QD lattices using a surface strain engineering method. Moreover, experimental results show that the lattice period and unit cell structure and size of the 2D lattices are tunable by adjusting the mesa lattice using lithography. The number of QDs in the lattice basis is also adjustable by careful tuning of the Indium flux. This technique, which should be applicable to a wide range of QDs materials systems, opens up the possibility of exploring, in a controlled manner, the physical properties of 2D and 3D QD lattices in semiconductors.

REFERENCES

The following references are herein incorporated by reference herein:

1. J.-Y. Marzin, J.-M. Gerard, A. Izrel, D. Barrier, and G. Bastard, Phys. Rev. Lett. 73, 716 (1994).
2. D. Leonard, M. Krishnamurthy, C. M. Reaves, S. P. DenBaars, and P. M. Petroff, Appl. Phys. Lett. 63, 3203 (1993).
3. Q. Xie, A. Madhukar, P. Chen, and N. P. Kobayashi, Phys. Rev. Lett. 75, 2542 (1995).
4. K. Georgesson, N. Carlson, L. Samuelson, W. Seifert, and L. R. Wallenberg, Appl. Phys. Lett. 67, 2981 (1995).
5. Y.-W. Mo, D. E. Savage, B. S. Swartzentruber, and M. G. Lagally, Phys. Rev. Lett. 65, 1020 (1990).
6. D. Leonard, K. Pond, and P. M. Petroff, Phys. Rev. B 50, 11687 (1994).
7. N. Kirstaedter, N. N. Ledentsov, M. Grundmann, D. Bimberg, V. M. Ustinov, S.S. Ruvimov, M. V. Maximov, P. S. Kopev, Z. I. Alferov, U. Richter, P. Werner, U. Gosele, and J. Heydenreich, Electron. Lett. 30, 1416 (1994).
8. M. Fricke, A. Lorke, J. P. Kotthaus, G. Medeiros-Ribeiro, and P. M. Petroff, Europhys. Lett. 36, 197 (1996).

9. H. Drexler, D. Leonard, W. Hansen, J.Kotthaus and P. M. Petroff, Phys. Rev. Lett. 73, 2252 (1994); G. Mendeiros-Ribeiro, D. Leonard, and P. M. Petroff, Appl. Phys. Lett. 66, 1767 (1995); R. Luyken, A. Lorke, et al., Appl. Phys. Lett. 74, 2486 (1999).
10. R. J. Warburton, B.T. Miller, C. D. Durr, C. Bödefeld, K. Karrai, J. P. Kothaus, G. Medeiros-Ribeiro, P. M. Petroff, and S. Huant, Phys. Rev. B 58, 16221 (1998).
11. E. Dekel, D. Gershoni, E. Ehrenfreund, D. Spektor, J. M. Garcia and P. M. Petroff, Phys. Rev. Lett. 80, 4991 (1998); F. Findeis, A. Zrenner, M. Markmann, G. Bohm, G. Abstreiter, Physica E, vol.7, (no.3–4(1999.)
12. A. Wojs, P. Hawrylak, S. Fafard, and L. Jacak, Physica E 2, 603 (1998).
13. M. Grundmann, N. N. Ledentsov, O. Siep, J. Böhrer, D. Bimberg, V. M. Ustinov, P. S. Kop'ev, and Zh. I. Alferov, Phys. Rev. B 53, 10509 (1996).
14. S. Maimon, E. Finkman, G. Bahir, S. E. Schacham, J. M. Garcia and P. M. Petroff. Appl. Phys. Lett. 73, 2003 (1998).
15. A. Wixforth, J. P. Kotthaus, W. Wegscheider, M. Bichler, Science, 283,.5406 (1999).
16. T. Lundstrom, W. Schoenfeld, H. Lee, P. M. Petroff, Science, 286, 2312 (1999).
17. D. Pan, E. Towe and S. Kennerly, Appl. Phys. Lett. 73, 1937 (1998).
18. D. G. Deppe, H. Huang, Appl. Phys. Lett.75, 3455 (1999); D. L. Huffaker, G. Park, Z. Zou, O. B. Shchekin, D. G. Deppe, Appl. Phys. Lett. 73, 2564 (1998).
19. D. S. L. Mui, D. Leonard, L. A. Coldren, P. M. Petroff, Appl. Phys. Lett. 66, 1620 (1995).
20. G. Jin, J. L. Liu, S. G. Thomas, Y. H. Luo, K. L. Wang and B.-Y. Nguyen, Appl. Phys. Lett. 75, 2752 (1999).
21. J. Tersoff, C. Teichert, and M. G. Lagally, Phys. Rev. Lett. 76, 1675 (1996).
22. G. Springholz, V. Holy, M. Pinczolits, and G. Bauer, Science 282, 734 (1998).
23. A. Konkar, A. Madhukar, and P. Chen, Appl. Phys. Lett. 72, 220 (1998).
24. G. Jin, J. L. Liu, and K. L. Wang, Appl. Phys. Lett. 76, 3591 (2000).
25. T. T. Ngo, P. M. Petroff, H. Sakaki, and J. L. Merz, Phys. Rev. B 53, 9618 (1996); T. T. Ngo and R. S. Williams, Appl. Phys. Lett. 66, 1906 (1995).
26. H. Lee, J. Johnston, J. Speck and P. M. Petroff, J. Vac. Sci. Techn. B, vol. 18, (no.4), 2193, (2000)

Conclusion

This concludes the description including the preferred embodiments of the present invention. The foregoing description of the preferred embodiment of the invention has been presented for the purposes of illustration and description. It is not intended to be exhaustive or to limit the invention to the precise form disclosed. Many modifications and variations are possible in light of the above teaching.

For example, the period of the: mesa lattice can be made smaller by using more refined lithography techniques. The materials systems to which this technique can be applied are varied, but must include a strain layer epitaxy for the stressor layer. Good candidate systems for applying these techniques include: the Si/SiGe system (with Si as a substrate), the InP/InGaP system (with InP or GaAs as a substrate), the GaN/AlGaN system (with GaN or sapphire as a substrate), as well as other coherently strained systems. All such systems should yield ordered lattices of QDs, if the techniques described above are applied.

It is intended that the scope of the invention be limited not by this detailed description, but rather by the claims appended hereto. The above specification, examples and data provide a complete description of the manufacture and use of the composition of the invention. Since many embodiments of the invention can be made without departing from the spirit and scope of the invention, the invention resides in the claims hereinafter appended.

What is claimed is:

1. A structure having strain-engineered, self-assembled, semiconductor quantum dots, comprising:
   a substrate having an ordered lattice of mesas patterned thereon;
   a stressor layer applied to the substrate; and
   a spacer layer applied to the stressor layer;
   wherein the quantum dots are deposited on the spacer layer, and islands of the quantum dots are nucleated and positioned on the ordered lattice of mesas as a function of the stressor layer's thickness.

2. The structure of claim 1, wherein the ordered lattice is periodic.

3. The structure of claim 1, wherein the ordered lattice is a two-dimensional lattice.

4. The structure of claim 3, wherein the two-dimensional lattice is replicated at periodic intervals along a growth direction to form a three-dimensional lattice.

5. The structure of claim 1, wherein a three-dimensional lattice is formed by growing closely-spaced layers of quantum dots on top of the ordered lattice.

6. The structure of claim 1, wherein unit cell dimensions of the ordered lattice are tunable.

7. The structure of claim 1, wherein the orientation of the quantum dots is tunable.

8. The structure of claim 1, wherein the number of quantum dots is tunable.

9. The structure of claim 1, wherein the number of islands is controlled through the mesa's size.

10. The structure of claim 1, wherein the number of islands is controlled through the amount of Indium deposited during step (c).

11. The structure of claim 1, wherein nearly all of the islands are formed between the mesas when the stressor layer is less than approximately 5 nm in thickness.

12. The structure of claim 1, wherein nearly all of the islands are formed on the mesas when the stressor layer is greater than approximately 20 nm in thickness.

13. The structure of claim 1, wherein the stressor layer is a coherently strained stressor layer.

14. The structure of claim 13, wherein nucleation is controlled by the presence of a periodic strain variation created by the mesas and the coherently strained stressor layer.

15. The structure of claim 1, wherein the ordered lattice has a higher photoluminescence (PL) efficiency than a random lattice.

16. A structure having strain-engineered, self-assembled, semiconductor quantum dots, wherein the structure is created using a process comprising:
   (a) patterning an ordered lattice of mesas on a substrate;
   (b) applying a stressor layer followed by a spacer layer to the substrate; and
   (c) depositing the quantum dots on the spacer layer, wherein islands of the quantum dots are nucleated and positioned on the ordered lattice of mesas as a function of the stressor layer's thickness.

17. The structure of claim 16, wherein the ordered lattice is periodic.

18. The structure of claim 16, wherein the ordered lattice is a two-dimensional lattice.

19. A The structure of claim 18, wherein the two-dimensional lattice is replicated at periodic intervals along a growth direction to form a three-dimensional lattice.

20. The structure of claim 16, wherein three-dimensional lattice is formed by growing closely-spaced layers of quantum dots on top of the ordered lattice.

21. The structure of claim 16, wherein unit cell dimensions of the ordered lattice are tunable.

22. The structure of claim 16, wherein the orientation of the quantum dots is tunable.

23. The structure of claim 16, wherein the number of quantum dots is tunable.

24. The structure of claim 16, wherein the number of islands is controlled through the mesa's size.

25. The structure of claim 16, wherein the number of islands is controlled through the amount of Indium deposited during step (c).

26. The structure of claim 16, wherein nearly all of the islands are formed between the mesas when the stressor layer is less than approximately 5 nm in thickness.

27. The structure of claim 16, wherein nearly all of the islands are formed on the mesas when the stressor layer is greater than approximately 20 nm in thickness.

28. The structure of claim 16, wherein the stressor layer is a coherently strained stressor layer.

29. The structure of claim 28, wherein nucleation is controlled by the presence of a periodic strain variation created by the mesas and the coherently strained stressor layer.

30. The structure of claim 16, wherein the ordered lattice has a higher photoluminescence (PL) efficiency than a random lattice.

* * * * *